(12) United States Patent
Ok et al.

(10) Patent No.: US 8,935,039 B2
(45) Date of Patent: Jan. 13, 2015

(54) METHOD FOR REDUCING DETECTION DATA OF A MONITORING DEVICE IN A VEHICLE, AND METHOD FOR MONITORING A VEHICLE DEFECT IN NEAR REAL TIME USING SAME

(75) Inventors: Min Hwan Ok, Suwon-si (KR); Hyun Seung Jung, Yongin-si (KR)

(73) Assignee: Korea Railroad Research Institute, Uiwang-si, Gyeonggi-do (KR)

( * ) Notice: Subject to any disclaimer, the term of this patent is extended or adjusted under 35 U.S.C. 154(b) by 0 days.

(21) Appl. No.: 13/993,464

(22) PCT Filed: Jul. 13, 2011

(86) PCT No.: PCT/KR2011/005125
§ 371 (c)(1),
(2), (4) Date: Jun. 12, 2013

(87) PCT Pub. No.: WO2012/081784
PCT Pub. Date: Jun. 21, 2012

(65) Prior Publication Data
US 2013/0268157 A1    Oct. 10, 2013

(30) Foreign Application Priority Data

Dec. 13, 2010  (KR) ................. 10-2010-0126998
Feb. 14, 2011  (KR) ................. 10-2011-0012637

(51) Int. Cl.
*G07C 5/08* (2006.01)
*G06F 17/00* (2006.01)
(Continued)

(52) U.S. Cl.
CPC ............... *G06F 17/00* (2013.01); *G07C 5/008* (2013.01); *H03M 7/00* (2013.01); *B61L 15/0081* (2013.01); *B61L 27/0083* (2013.01); *B60W 2050/021* (2013.01)
USPC ........................................ 701/31.4

(58) Field of Classification Search
CPC ..... H03M 3/04; H03M 3/042; H03M 7/3044; H03M 3/022; H04B 14/06; H04B 14/066; H04B 14/068; G07C 5/008
USPC .......... 701/31.4; 702/187, 188, 199; 375/244, 375/245, 247, 249, 250
See application file for complete search history.

(56) References Cited

U.S. PATENT DOCUMENTS 2,605,361 A * 7/1952 Cutler ........................ 375/247
3,800,225 A * 3/1974 Meares ..................... 375/245
(Continued)

FOREIGN PATENT DOCUMENTS

EP           110794 A1 * 6/1984 ............. G06F 15/20
GB         2069264 A  * 8/1981 ............. H03K 13/02
(Continued)

OTHER PUBLICATIONS

JPO machine translation of JP 05-197892 (original JP document published Aug. 6, 1993).*
(Continued)

*Primary Examiner* — Behrang Badii
*Assistant Examiner* — David Testardi
(74) *Attorney, Agent, or Firm* — Panitch Schwarze Belisario & Nadel LLP

(57) ABSTRACT

A method for reducing data of sensor devices in a vehicle includes collecting detection data periodically from the sensor devices and calculating an average value of the data collected during a cycle. The collected data may be compared with the calculated values and a deviation with previous data may be calculated by an upper and lower value difference method. A difference between the collected data and average values may also be calculated by a deviation method. The calculated value is stored. Data from a plurality of running vehicles may be periodically transmitted to a driving control center in order to monitor devices related to operations of all of the running vehicles in near real time.

3 Claims, 4 Drawing Sheets

(51) Int. Cl.
*G07C 5/00* (2006.01)
*H03M 7/00* (2006.01)
*B61L 15/00* (2006.01)
*B61L 27/00* (2006.01)
*B60W 50/02* (2012.01)

(56) References Cited

U.S. PATENT DOCUMENTS

| | | | | |
|---|---|---|---|---|
| 3,980,953 | A * | 9/1976 | Nance et al. | 375/248 |
| 5,621,851 | A * | 4/1997 | Moriya et al. | 704/212 |
| 5,687,255 | A * | 11/1997 | Yeh | 382/232 |
| 5,791,342 | A * | 8/1998 | Woodard | 600/300 |
| 5,822,457 | A * | 10/1998 | Yeh | 382/232 |
| 6,049,738 | A | 4/2000 | Kayama et al. | |
| 6,745,153 | B2 * | 6/2004 | White et al. | 702/184 |
| 7,113,852 | B2 * | 9/2006 | Kapadia et al. | 701/36 |
| 7,523,019 | B2 * | 4/2009 | Thiel et al. | 702/189 |
| 7,548,834 | B2 * | 6/2009 | Morgenthal | 702/189 |
| 2006/0244587 | A1 * | 11/2006 | Humphries et al. | 340/539.13 |
| 2008/0027678 | A1 * | 1/2008 | Miller | 702/182 |
| 2008/0074276 | A1 * | 3/2008 | Valencia et al. | 340/635 |
| 2010/0198556 | A1 | 8/2010 | Kost | |
| 2012/0022741 | A1 * | 1/2012 | Moore et al. | 701/33 |

FOREIGN PATENT DOCUMENTS

| | | | | | |
|---|---|---|---|---|---|
| JP | 61053833 | A * | 3/1986 | | H03M 7/36 |
| JP | 05197892 | A * | 8/1993 | | G08C 19/00 |
| JP | 07-023502 | A | 1/1995 | | |
| JP | 08247798 | A * | 9/1996 | | G01D 9/00 |
| JP | 2004032176 | A * | 1/2004 | | H04Q 7/38 |
| JP | 2005-028945 | A | 2/2005 | | |
| JP | 2009-220815 | A | 10/2009 | | |
| JP | 2010-254177 | A | 11/2010 | | |
| KR | 10-2000-0059333 | A | 10/2000 | | |
| KR | 10-2003-0047179 | A | 6/2003 | | |
| KR | 10-2005-0108533 | A | 11/2005 | | |
| KR | 10-2006-0004854 | A | 1/2006 | | |
| KR | 10-0627328 | B1 | 9/2006 | | |
| WO | WO 2006121401 | A1 * | 11/2006 | | G07C 5/00 |

OTHER PUBLICATIONS

JPO machine translation of JP 08-247798 (original JP document published Sep. 27, 1996).*

JPO machine translation of JP 2004-32176 (original JP document published Jan. 29, 2004).*

Int'l Search Report issued Feb. 15, 2012 in Int'l Application No. PCT/KR2011/005125.

Lee et al, "Implementation of Storage Manager to Maintain Efficiently Stream Data in Ubiquitous Sensor Networks," Journal of the Institute of Electronics Engineers of Korea, vol. 46, No. 3, pp. 24-33 (May 2009).

* cited by examiner

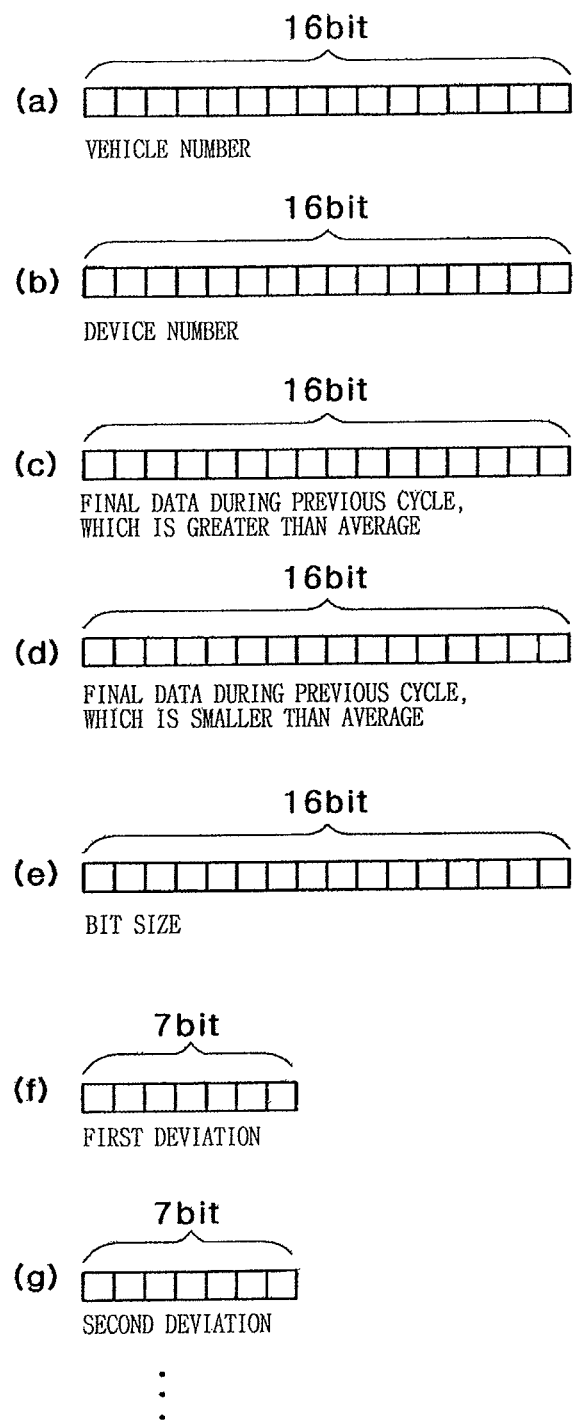

METHOD FOR REDUCING DETECTION DATA OF A MONITORING DEVICE IN A VEHICLE, AND METHOD FOR MONITORING A VEHICLE DEFECT IN NEAR REAL TIME USING SAME

TECHNICAL FIELD

The present invention relates to a method for reducing detection data of a monitoring device in a vehicle, which reduces a data size without compressing transmitted data in a system, and a method for monitoring a vehicle defect in near real time using the same, and more particularly, the present invention relates to a method for monitoring a vehicle defect in near real time by reducing network traffic and a use rate of a system resource by reducing transmitting data periodically measured by using a sensor with respect to each device related to operations of a vehicle to a driving control center that manages safety of a running vehicle with the size of the data being reduced by providing an upper and lower value difference method or a deviation method which are data reduction methods using an average and a deviation of data detected by a monitoring device.

BACKGROUND ART

In recent years, with the development of an industry, need for an automobile, a freight vehicle, and a high-speed train has further increased and damage has occurred due to a lot of vehicular accidents caused by problems such as an increase in the number of vehicles and a high-speed of the vehicle. Such vehicular accidents have become more severe, and as a result, the yearly physical and human tolls due to the vehicular accidents have been compared to causalities of war.

The accident may be caused by a driver's mistake but are often caused by a vehicle defect. Therefore, advanced countries have gradually recognized the necessity of national management for these vehicles.

Therefore, the defect, which may occur in the vehicle, is determined in advance by sensing main devices installed in the vehicle in order to more rapidly cope with the existence of the defects in the vehicles and transmitting the information to the driving control center, which manages the devices, to prevent an accident which may occur from a defective vehicle.

However, in the case where data measured at a predetermined cycle is transmitted to the driving control center so as to monitor a plurality of main devices of multiple running vehicles in near real time, a capacity of data to be transmitted and processed is vast, and as a result, a large bandwidth of a network is required and a lot of resources are required to store the transmitted data. Therefore, reduction of the data transmitted from the vehicle is requested to access data in near real time or whenever necessary.

In a method of compressing massive data, a conventional audio compression technology that compresses audio data is lossy compression of deleting a sound band that humans cannot hear, a JPEG compression method of compressing a still image is compression of a color still image by deleting information which is duplicated on a screen, a GIF compression method is non-lossy compression, but can express only 256 colors and thus has a limit in the amount of data, and MPEG for compressing a moving picture can compress a lot of data.

However, the data compression method as lossy compression of deleting voice or image information, which is less acoustically or visually sensitive, is accompanied with loss of information and even in the case of the non-lossy compression, a complicated calculation process for compression and restoration is requested, and as a result, a lot of resources such as a high-speed processor and massive memories are requested.

In particular, in a defect monitoring system that monitors whether a main device of the running vehicle is defective, data indicating state information of each device in the vehicle is much less than image data in terms of a bit number, but a processor in an embedded system processing information from various sensors used for monitoring in the vehicle is not capable of performing a calculation for the compression, and as a result, a delay inevitably occurs in some cases.

This may be a large problem due to the delay of the data in the defect monitoring system that monitors the defect in near real time so as to rapidly cope with even a small defect of the main device in the vehicle and if the compressed data is not restored to its original data, the compressed data cannot be immediately used and the data cannot be compressed before a predetermined amount of data is collected, and as a result, in some cases, it is not appropriate to use compression when the data needs to be transmitted immediately.

Further, data transmitted from each device of the vehicle requires accuracy in terms of information, and as a result, there is a problem that lossy compression occurs in the data compression technology even though non-lossy compression is presumed.

DISCLOSURE

Technical Problem

The present invention is contrived to solve the abovementioned problem and an object of the present invention is to provide a method for monitoring a vehicle defect in which an upper and lower value difference method or a deviation method for reducing and restoring detection data without loss through a simple calculation is provided so that a monitoring system (health monitoring), which monitors all defects of the vehicle, periodically transmits massive data detected from a plurality of running vehicles to a driving control center in order to monitor devices related to operations of all of the running vehicles in near real time.

Technical Solution

In order to achieve the object, a method for reducing detection data of a monitoring device in a vehicle and a method for monitoring a vehicle defect in near real time by using the same include:

collecting detection data periodically detected from the sensor devices; calculating an average value of the data collected during a cycle; comparing each collected data with each calculated average value;

calculating, by an upper and lower value difference method, a deviation with previous data which is equal to or greater than an average value for a data in which a result of the comparing is equal to or greater than the average value, and a deviation with previous data which is less than the average value for a data which is less than the average value; and storing the deviation value obtained by performing the calculating by the upper and lower value difference method.

The method for monitoring a vehicle defect includes: collecting detection data periodically detected from a plurality of defect monitoring devices that is installed in a vehicle and monitors a defect associated with an operation of the vehicle;

calculating a deviation from the collected detection data; generating a frame including the calculated deviation, a unique vehicle number set for each vehicle, a unique device number set in the corresponding vehicle, a final data which is equal to or greater than the average during a previous cycle, a final data which is less than the average during the previous cycle, and a bit size to express the deviation; transmitting the generated data frame to a driving control center; restoring the data to its original data by calculating each deviation of the previous data and of the bit size unit by distinguishing the transmitted vehicle number and device number in the driving control center; and detecting a defect in the corresponding device of the vehicle from the restored data.

Advantageous Effects

According to a method for reducing detection data of a monitoring device in a vehicle and a method for monitoring a vehicle defect in near real time using the same according to the present invention, by using the fact that data of a vehicle part is varied by a small variation in a stable operating state, it is possible to reduce and transmit measured data to be transmitted by sensing states of main devices in a whole vehicle with a sensor without data loss through reducing the size of data by performing a simple calculation such as calculation of an average or deviation by using the upper and lower value difference method or the deviation method. Therefore, network traffic due to the massive data transmitted from the plurality of running vehicles can be reduced, and the load on a server, which is generated in storing and processing data in the driving control center, can be remarkably reduced, and thus, defects in the main devices of the vehicles can be detected in near real time.

DESCRIPTION OF DRAWINGS

FIG. 4 is a flowchart of a data bit transmitted to a driving control center within one cycle according to an embodiment of the present invention.

BEST MODE

Hereinafter, configurations and operations for embodiments of a method for reducing detection data of a monitoring device in a vehicle and a method for monitoring a vehicle defect in near real time using the same according to the present invention will be described in detail with reference to illustrated drawings.

Figure 1:
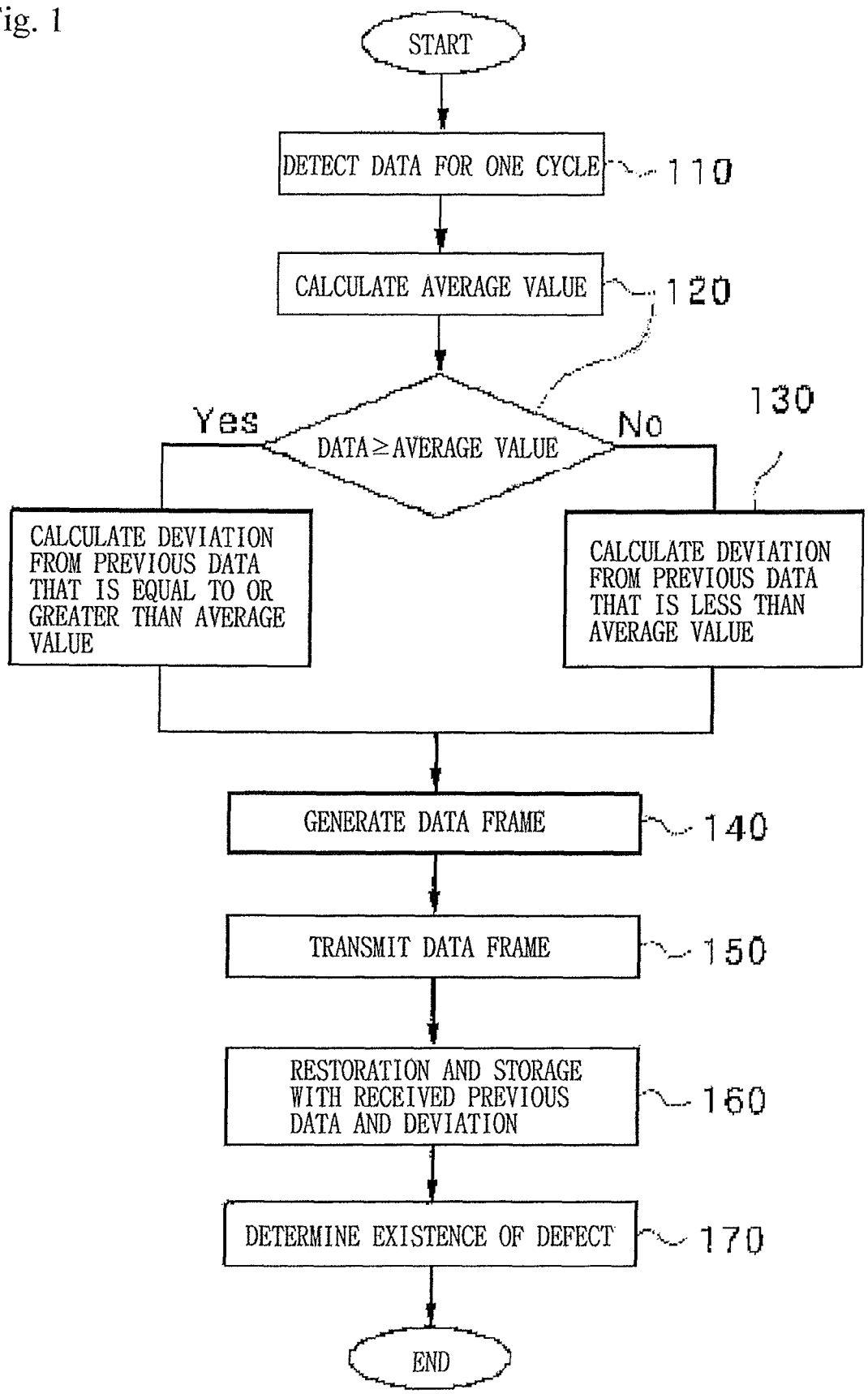
FIG. 1 is a flowchart illustrating data reduction and defect monitoring by an upper and lower value difference method within one cycle according to an embodiment of the present invention.

As an embodiment of data (e.g., an engine output value) periodically detected in each of all devices of all vehicles monitored by a driving control center during one cycle, data sensed and measured every cycle is received from a specific device in a vehicle as illustrated in FIG. 1 (step 110).

An average of the collected data every cycle is calculated and thereafter, each data is compared with the average (step 120).

When the compared result is equal to or greater than the average, a deviation from a final data value, which is equal to or greater than a previous average, is calculated and when the compared result is smaller than the average, a deviation from the final data value, which is smaller than the previous average, is calculated. However, when a first data during a present cycle is equal to or greater than the average, a deviation between the first data and the final data, which is equal to or greater than the average during the previous cycle, is acquired, when the first data during the present cycle is smaller than the average, a deviation between the first data and the final data, which is less than the average during the previous cycle, is acquired, and the final data, which is equal to or greater than the average during the previous cycle, and the final data, which is less than the average during the previous cycle, are initialized to 0 during initial measurement (step 130).

This method is called an upper and lower value difference method, in which each data is first compared with the average through the calculation and when each data is equal to or greater than the average, a variation in deviation among data, which are equal to or greater than the average, is recorded, and when each data is less than the average, a variation in deviation among data, which are less than the average, is recorded, and thus overall data is reduced by reducing the bit number of data indicating one cycle by the deviation by using the fact that detection data values for main devices in the vehicle is varied by a very small variation in a stable operating state, and the data is restored to the original data by using the deviation calculated from the first data and the data even in restoring the data.

As yet another embodiment, a deviation method is used, in which when a deviation, which is obtained by calculating a difference between each data sensed from a specific device in the vehicle during one cycle and the average of the data during one cycle, is recorded and the average and the deviation of the detection data for the main devices in the vehicle are transmitted, the data is restored to the original data by using the deviation from the transmitted average value (step 130).

Figure 2:
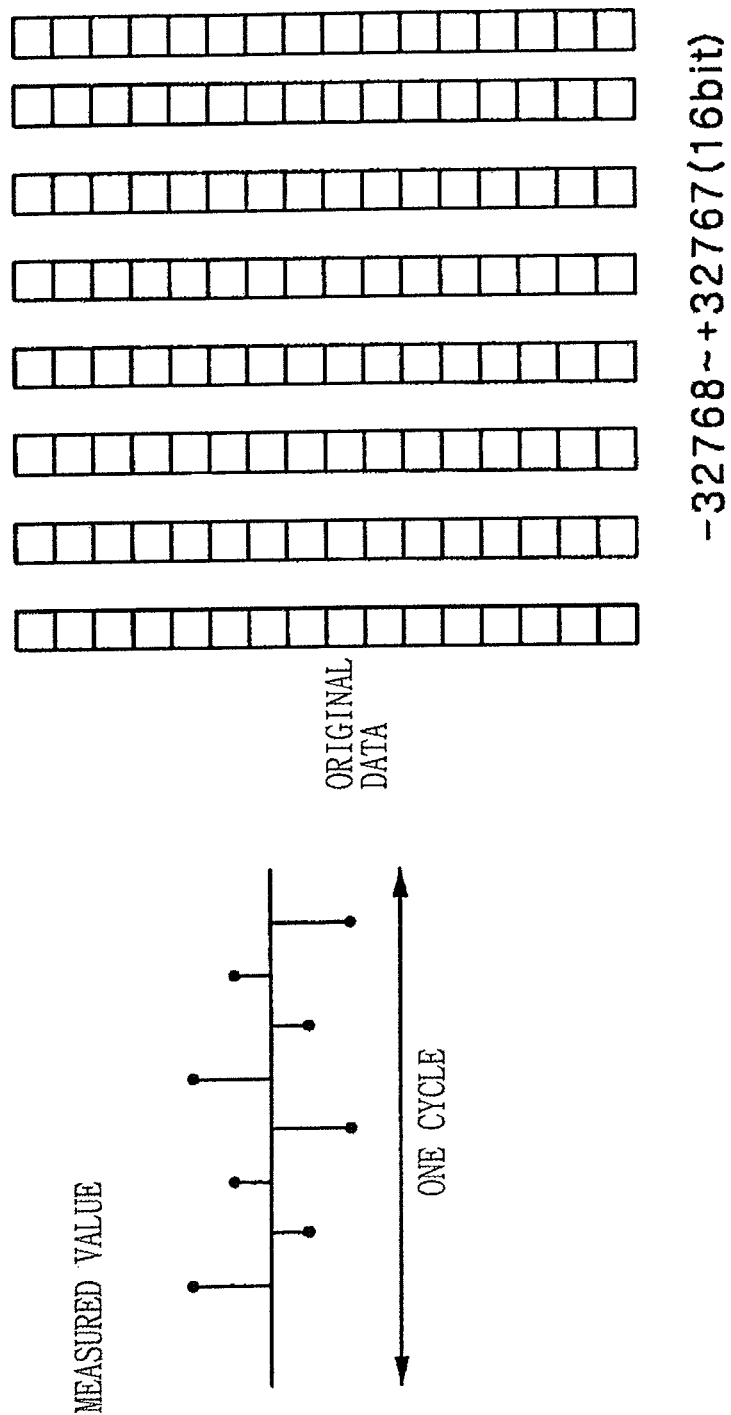
FIG. 2 is an exemplary diagram of a bit number of original data detected by a sensor according to an embodiment of the present invention.
Figure 3:
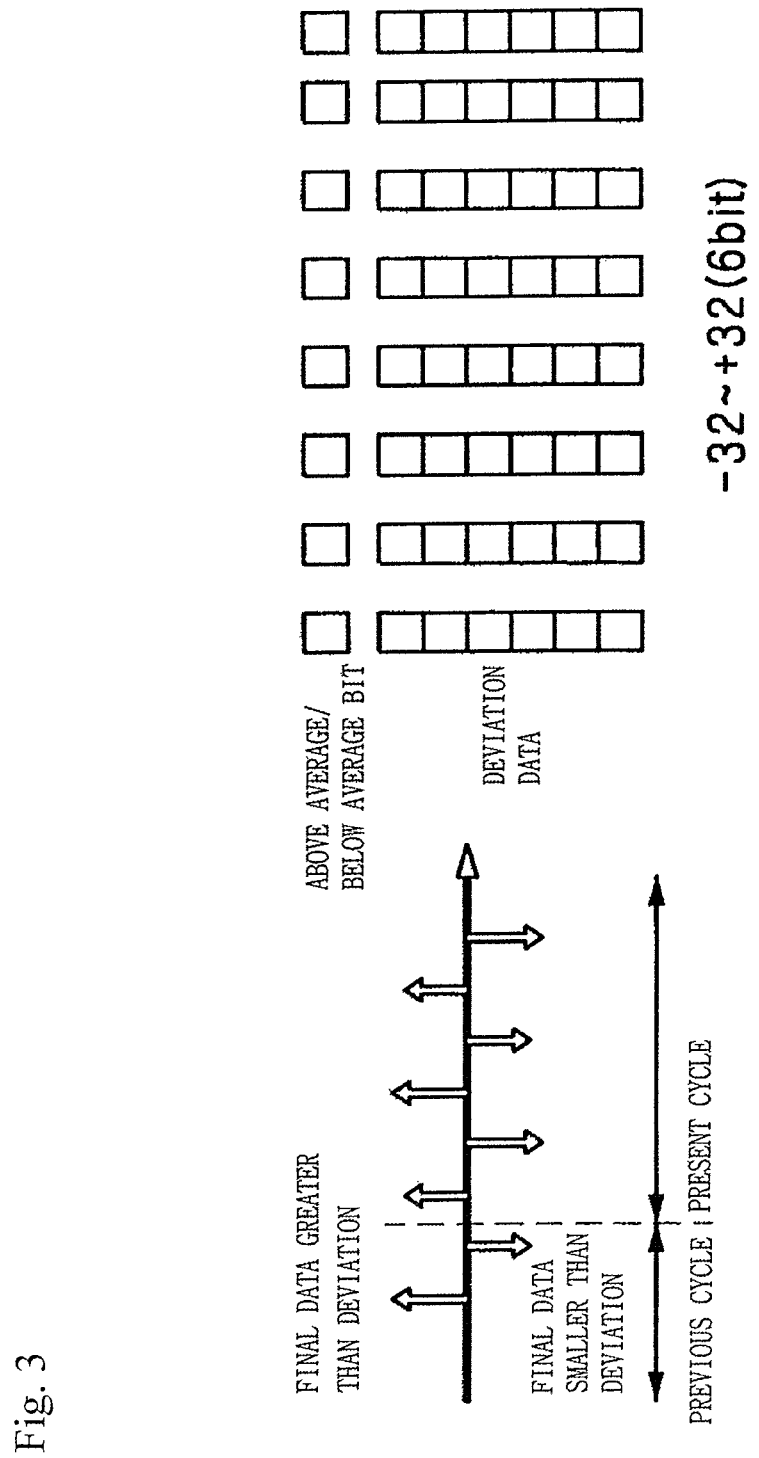
FIG. 3 is an exemplary diagram of the bit number of reduced data generated by an upper and lower value difference method according to an embodiment of the present invention.

Referring to FIGS. 2 and 3, after upper and lower values of the data calculated by the upper and lower value difference method are distinguished based on the average of the data measured during one cycle, a previous value among values greater than the average or a previous value among values smaller than the average are used, and as a result, when the variation in the state of the device is not great, the difference from the previous data is small, and thus only the small difference value is transmitted as actually transmitted data. Therefore, even though the difference value includes a sign bit expressed as a positive number or a negative number, the difference value may be expressed as a bit number much smaller than a bit number used in the original data. That is, only the small variation, which occurs in the stable operating state, is generally transmitted as data, and as a result, the small variation may be expressed as a bit number which is much smaller than the bit number of the original data which is purely measured.

However, since the bit number variably varies depending on a variation in operating state of a part every cycle, a bit size required to transmit data is calculated from a value of a largest deviation between data above average or below average within one cycle.

The average and the deviation between the previous data are calculated by a simple four fundamental arithmetic operation, and as a result, a calculation time to hinder near real-time monitoring is not required even in reducing and restoring data.

After deviation data is obtained by performing the calculation, as illustrated in FIG. 4, a data frame is generated, which includes a unique vehicle number set for each vehicle, which is configured by 16 bits of FIG. 4(*a*), a unique device number set in the corresponding vehicle configured by 16 bits of FIG. 4(*b*), final data which is greater than the average value during the previous cycle configured by 16 bits of FIG. 4(*c*), final data which is smaller than the average value during the previous cycle configured by 16 bits of FIG. 4(*d*), and a bit size to express a deviation configured by 16 bits of FIG. 4(*e*), and a deviation configured by 7 bits of FIGS. 4(*f*) and 4(*g*), which are calculated, together with the detection data for each device in the vehicle and the calculated deviation data in generating a data frame to be sent to the driving control center (step 140).

Therefore, various devices of a plurality of devices may be distinguished in the driving control center.

However, the bit numbers expressing the vehicle number and the device number may be determined to be easily distinguished from each other and the bit number of the bit size may be changed depending on a purpose.

The data frame measured within one cycle for each of the main devices in driving the corresponding vehicle is transmitted to the driving control center through a network (step 150).

The driving control center distinguishes the transmitted vehicle number and a device number per device and calculates each deviation distinguished as the transmitted previous data and bit size to restore and store the original data (step 160).

The driving control center accesses data for each device of the vehicle from the stored restoration data to determine whether the device is defective (step 170).

The upper and lower value difference method is an algorithm of reducing the size of the data in each vehicle in order to reduce a data amount received at one time when the data detected in each device of the vehicle is transmitted to the driving control center and the driving control center receives data from a plurality of vehicles.

In this specification, preferred embodiments of the method for reducing detection data of the monitoring device in the vehicle and the method for monitoring a vehicle defect in near real time using the method have been described, but the present invention is not limited thereto. Various modifications can be made within the scope of the appended claims and the accompanying drawings and are also included in the scope of the present invention.

The invention claimed is:

1. A method for reducing data using a deviation method for monitoring a vehicle defect in near real time, wherein a defect monitoring system is provided in each vehicle of a plurality of vehicles, for detecting a defect in one or more components of a vehicle, and a driving control center is provided for detecting defects in components of each vehicle by receiving detection data from the defect monitoring system, the method comprising:

collecting, by the defect monitoring system, detection data periodically detected from a plurality of defect monitoring devices that are installed in a vehicle and monitor a defect associated with an operation of the vehicle;

calculating, by the defect monitoring system, a deviation from the collected detection data;

generating, by the defect monitoring system, a frame including the calculated deviation, a unique vehicle number set for each vehicle, a unique device number set in the corresponding vehicle, a final data which is equal to or greater than an average value during a previous cycle, a final data which is less than the average value during the previous cycle, and a bit size to express the deviation;

transmitting, by the defect monitoring system, the generated data frame to the driving control center;

restoring, by the driving control center, the data to its original data by calculating each deviation of the previous data and of the bit size unit by distinguishing the transmitted vehicle number and device number in the driving control center; and detecting, by the driving control center, a defect in the corresponding component of the vehicle from the restored data.

2. The method of claim 1, further comprising:
calculating a deviation of the detection data, in the calculating by the defect monitoring system, by an upper and lower value difference method.

3. The method of claim 1, further comprising:
calculating the deviation of the detection data, in the calculating by the defect monitoring system, by a deviation method.

* * * * *